(12) United States Patent
Zhang et al.

(10) Patent No.: US 8,927,872 B2
(45) Date of Patent: Jan. 6, 2015

(54) THERMAL PAD AND METHOD OF FORMING THE SAME

(75) Inventors: Guangjun Zhang, Beijing (CN); Yuanchun Xie, Beijing (CN)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 509 days.

(21) Appl. No.: 13/202,209

(22) PCT Filed: Feb. 20, 2009

(86) PCT No.: PCT/CN2009/000173
§ 371 (c)(1),
(2), (4) Date: Sep. 15, 2011

(87) PCT Pub. No.: WO2010/094154
PCT Pub. Date: Aug. 26, 2010

(65) Prior Publication Data
US 2012/0024575 A1  Feb. 2, 2012

(51) Int. Cl.
*H05K 1/00* (2006.01)
*H01L 23/367* (2006.01)
*H05K 1/02* (2006.01)
*H05K 1/18* (2006.01)
*H05K 3/00* (2006.01)
*H05K 3/42* (2006.01)

(52) U.S. Cl.
CPC .......... *H01L 23/3677* (2013.01); *H05K 1/0204* (2013.01); *H05K 1/0206* (2013.01); *H05K 1/182* (2013.01); *H05K 3/0061* (2013.01); *H05K 3/429* (2013.01); *H05K 2201/0959* (2013.01); *H05K 2201/09745* (2013.01); *H05K 2201/10166* (2013.01); *H05K 2201/10416* (2013.01); *H05K 1/0243* (2013.01)
USPC .......................................... 174/252; 174/258

(58) Field of Classification Search
CPC ....... H05K 1/111; H05K 1/112; H05K 1/113; H05K 1/114; H05K 1/116; H05K 1/119; H05K 1/115; H05K 1/0206
USPC .......... 174/252, 250, 253, 255–259, 262, 263, 174/265
See application file for complete search history.

(56) References Cited

U.S. PATENT DOCUMENTS

| 5,900,674 A | 5/1999 | Wojnarowski et al. | |
|---|---|---|---|
| 6,127,833 A | 10/2000 | Wu et al. | |
| 6,580,174 B2 | 6/2003 | McCormick et al. | |
| 2008/0277776 A1* | 11/2008 | Enomoto | 257/700 |
| 2009/0294165 A1* | 12/2009 | Thomas | 174/263 |

FOREIGN PATENT DOCUMENTS

| CN | 1561655 A | 1/2005 |
|---|---|---|
| JP | 2001094226 A | 4/2001 |

* cited by examiner

*Primary Examiner* — Tremesha S Willis
(74) *Attorney, Agent, or Firm* — Rothwell, Figg, Ernst & Manbeck P.C.

(57) ABSTRACT

A thermal pad (602, 612, 622, 702, 712) formed on a Printed Circuit Board and a method (900) of formed the thermal pad (602, 612, 622, 702, 712) are provided. The thermal pad (602, 612, 622, 702, 712) comprises in its interior one or more coins (604, 614, 624, 704, 714) has a height equal to a thickness of the PCB, and is made of metal or alloy, inserted into a corresponding one of one or more plated cutouts straight through the PCB in the thermal pad, and bonded to side walls of the corresponding one of the one or more plated cutouts with a paste capable of resisting a temperature of 250° C. or above. The plurality of through via (606, 616, 626, 706, 716) are plated, and lugged with a solder mask. The thermal pad (602, 612, 622, 702, 712) has a flat top surface and a flat bottom surface, either of which is coplanar with a corresponding one of top and bottom surfaces of the PCB. A PCB having formed thereon the above thermal pad (602, 612, 622, 702, 712) is also provided.

24 Claims, 16 Drawing Sheets

THERMAL PAD AND METHOD OF FORMING THE SAME

CROSS-REFERENCE TO RELATED APPLICATION

This application is a 35 U.S.C. §371 National Phase Entry Application from PCT/CN2009/000173, filed Feb. 20, 2009, and designating the United States, the disclosure of which is incorporated by reference herein in its entirety.

TECHNICAL FIELD

The present invention relates generally to a Printed Circuit Board (PCB) and, more particularly, to a thermal pad formed on a PCB and a method of forming the thermal pad.

BACKGROUND

Power amplifiers (PAs) are important units in various communication systems. There are usually two ways to improve performance of a PA. One is to increase an efficiency of the PA, and the other is to improve heat dissipation of the PA.

A power transistor, as a core device of a PA, produces the majority of heat in the PA. In general, the higher the power of a power transistor is, the more the power transistor produces heat. Therefore, for a high power transistor contained in a PA, heat dissipation thereof has to be carefully considered for performance of the PA.

Heat dissipation methods for a high power transistor such as a high power Radio Frequency (RF) transistor used in a radio communication base station have been proposed in the prior art. How to fix the high power transistor to a PCB is a main concern of the heat dissipation methods.

Currently there are two kinds of solutions to fix a power transistor to a PCB. One kind of solution is a manual fixing solution in which for example screws are used to fix a flange of a power transistor onto a heat sink, which is called a bolt down technique. The bolt down technique is generally used for a high power RF transistor with a ceramic package and a RF output power of more than 20 W. Manual work of an operator is generally needed for implementing the bolt down technique. Hence, the technique greatly depends on the operator's experience, resulting in a low working efficiency, a low consistency, and a low stability.

The other kind of solution is a Surface Mounted Technique (SMT) solution in which pins and a flange of a power transistor are soldered on pads of a PCB. The SMT solution comprises two types of techniques. One type of technique is a through-via technique where a pad for soldering to the flange of the power transistor has some plugged through vias, which is schematically shown in FIG. 1. Referring to FIG. 1, there are a lot of plated through vias on a pad of a PCB under a power transistor. These through vias are plugged with an epoxy, a metal, or any other suitable material. The through-via technique has a limited ability to dissipate heat, so it is only applicable to a low power transistor, e.g. a transistor with a power of no more than 20 W. Moreover, although the ability to dissipate heat will be improved if these through vias are plugged with a metal or copper plated thereon is thickened, a cost of the PCB will have a significant increase, for example, an increase of about 30 percent.

The other type of technique in the SMT solution is an attached coin technique where a pad for soldering to the flange of the power transistor has an attached coin. In the attached coin technique a PCB is produced with a cutout. According to a shape of the cutout, the attached coin technique is divided into a straight through cutout technique, a stepped coin technique, and an embedded coin technique.

There are two structures for the straight through cutout technique. One is called through rout, and the other is called stamped coin and pedestal, which are schematically illustrated in FIGS. 2A and 2B, respectively. For the through rout, a high temperature solder or a conductive paste is used to attach a coin to a PCB, and then a RF power transistor is soldered to the coin and the PCB together with other components. For the stamped coin and pedestal, a coin and a PCB are fixed on a pedestal with a high temperature solder or a conductive glue. Then the whole PCB with the coin and the pedestal goes through reflow for soldering a surface mounted RF power transistor and other components.

FIG. 3A schematically illustrates a configuration of a PCB having a RF power transistor soldered thereon through the stepped coin technique. To implement the stepped coin technique, different layers in the PCB have different cutout sizes. For example, as shown in FIG. 3B, for a four-layer PCB, a cutout on the two upper layers 1 and 2 has a size of 10 mm*20 mm, and the cutout on the two lower layers 3 and 4 has a size of 15 mm*30 mm. So the cutout looks like a step on the PCB from a side view. PCB manufacturers generally handle this kind of PCB with two ways. One way is to make cutouts with different sizes in layers 1, 2 and layers 3, 4. Then a core and a prepreg are stacked, and the PCB is produced in a normal process. The other way is to make cutouts with the same size in all of layers 1, 2, 3 and 4 and produce the PCB in a normal process. Then special cutting tools are used to enlarge the cutout on layers 3 and 4.

In the configuration of the PCB as shown in FIG. 3A, a metal coin is soldered on the stepped cutout of the PCB by a sweat bonding process. Pins and a flange of the RF power transistor are respectively soldered on the PCB and on the metal coin at the same time through an SMT line.

FIG. 4 schematically illustrates a configuration of a PCB having a RF power transistor soldered thereon through the embedded coin technique. As shown in FIG. 4, a coin has two "wings". A top and a bottom surface of the coin have the same size as a flange of the RF power transistor. A size of a cutout in middle layers of the PCB is larger than that of the cutout in a top and a bottom layer thereof, so the cutout has concave recesses as shown, which can fix the two "wings" of the coin. A process for implementing the embedded coin technique is very complex. Separate cores and prepregs should be cut out with required sizes and then the coin is embedded before PCB pressure.

The attached coin technique comprising the various techniques as stated above has a number of drawbacks. One of the drawbacks is that the attached coin technique is more complex than the through-via technique, resulting in a higher manufacture cost. For example, it is necessary for the straight through cutout technique and the stepped coin technique to solder or paste a coin to a PCB from a bottom side of the PCB before a normal reflow process. The embedded coin technique is the most expensive in the attached coin technique, which increases a PCB cost by over 50 percent. Moreover, only one PCB supplier can provide the embedded coin technique, hence leading to a problem of a single source.

Another drawback is that the attached coin technique has higher requirements on design and PCB manufacturer, because RF performance is significantly impacted by mechanical precision, and quality of connection between the coin and the PCB. Without good connection quality and tolerance controlling, the coin has a risk to fall down when going through reflow. Bad soldering quality and mechanical tolerance can reduce the RF performance.

A further drawback is that the attached coin technique has many application limits as follows:

- To use the attached coin technique, a thickness of the PCB should meet minimum requirement in order to keep less distortion and provide good adsorption affinity to the coin under the PCB. That is, the thickness of the PCB can not be less than a certain value.
- The coin size can not be as small as desired in view of produce technique and reliability. This means there may be some redundance for the coin size.
- For the through rout in the straight through cutout technique, RF reference ground plane is only on the bottom layer, which means the PCB can not be in any thickness in view of RF ground loop.
- In the embedded coin technique, the coin should be embedded in the PCB. PCB stack should meet a certain requirement to embed the coin therein. For a multilayer PCB, if the number of the layers is above 10, it is hard to implement the embedded coin technique.

SUMMARY

Therefore, it is an object of the present invention to address at least some of the above drawbacks by providing a novel thermal pad formed on a PCB and a method of forming the thermal pad.

According to one aspect of the present invention, there is provided a thermal pad formed on a PCB. The thermal pad comprises in its interior one or more coins and a plurality of through vias. Each of the one or more coins has a height equal to a thickness of the PCB, and is made of metal or alloy, inserted into a corresponding one of one or more plated cutouts straight through the PCB in the thermal pad, and bonded to side walls of the corresponding one of the one or more plated cutouts with a paste capable of resisting a temperature of 250° C. or above. The plurality of through vias are plated, and plugged with a solder mask. The thermal pad has a flat top surface and a flat bottom surface, either of which is coplanar with a corresponding one of top and bottom surfaces of the PCB.

According to another aspect of the present invention, there is provided a PCB having formed thereon the above thermal pad.

According to yet another aspect of the present invention, there is provided a method of forming the above thermal pad on a PCB. The method comprises the steps of forming one or more coins, each being made of metal or alloy and having a height equal to a thickness of a net PCB; forming one or more cutouts and a plurality of through vias straight through the net PCB in an area for forming the thermal pad, each of the one or more cutouts corresponding to a corresponding one of the one or more coins and having the same size as the corresponding one of the one or more coins; plating the one or more cutouts and the plurality of through vias; inserting the one or more coins into the corresponding ones of the one or more plated cutouts and bonding the one or more coins to side walls of the corresponding ones of the one or more plated cutouts with a paste capable of resisting a temperature of 250° C. or above; plugging the plurality of plated through vias with a solder mask; and flattening a top surface and a bottom surface of the PCB with the thermal pad via a surface process.

BRIEF DESCRIPTION OF THE DRAWINGS

The above and other aspects, features and advantages of the present invention will be more apparent from the following more particular description thereof, presented in conjunction with the accompanying drawings, in which.

Corresponding reference characters indicate corresponding components throughout the several views of the drawings.

DETAILED DESCRIPTION

The embodiments set forth below represent the necessary information to enable those skilled in the art to practice the present invention and illustrate the best mode of the practicing the present invention. Upon reading the following description in light of the accompanying drawing figures, those skilled in the art will understand the concepts of the present invention and will recognize applications of these concepts not particularly addressed herein. It should be understood that these concepts and applications fall within the scope of the disclosure and the accompanying claims.

Figure 1:
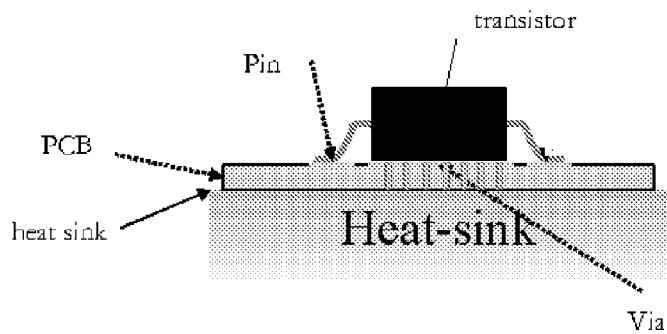
FIG. 1 schematically shows a through-via technique where a pad for soldering to a flange of a power transistor has some plugged through vias.
Figure 2A:
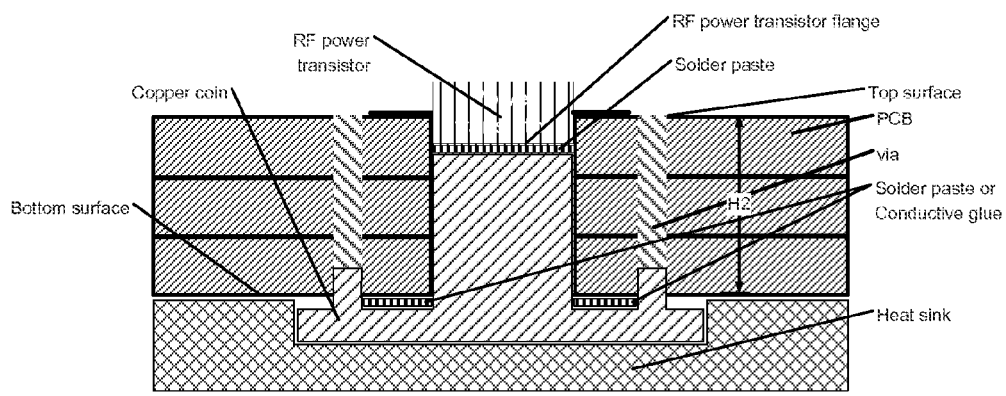
FIGS. 2A and 2B schematically illustrate two structures for a straight through cutout technique.
Figure 2B:
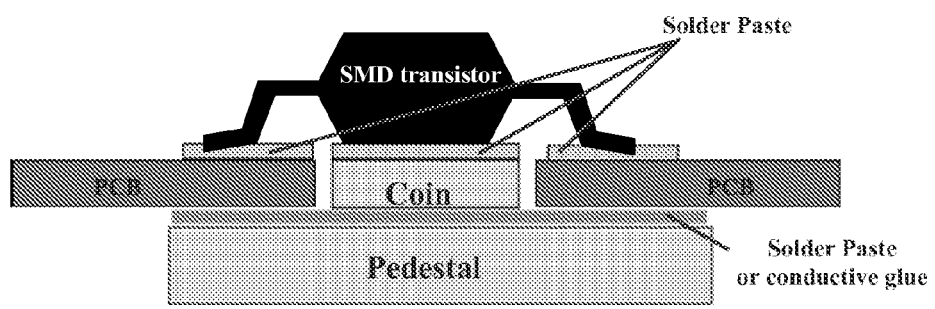
Figure 3A:
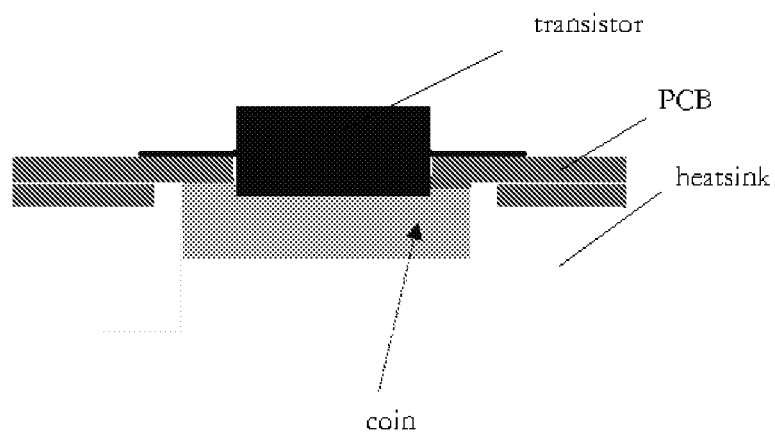
FIG. 3A schematically illustrates a configuration of a PCB having a RF power transistor soldered thereon through a stepped coin technique.
Figure 3B:
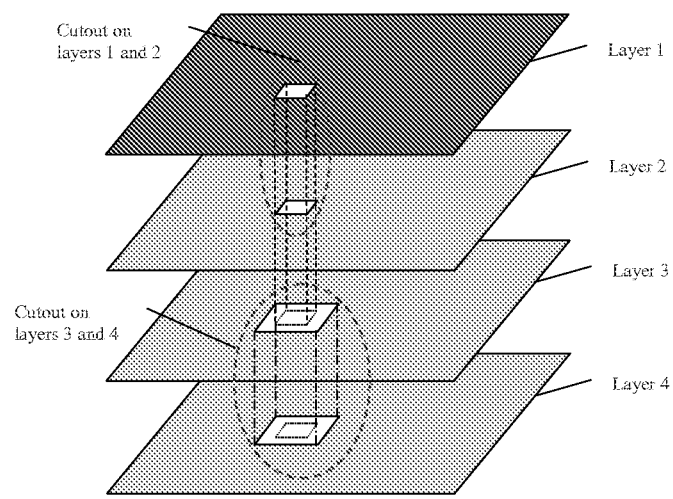
FIG. 3B schematically shows a cutout with different sizes on different layers of a four-layer PCB.
Figure 4:
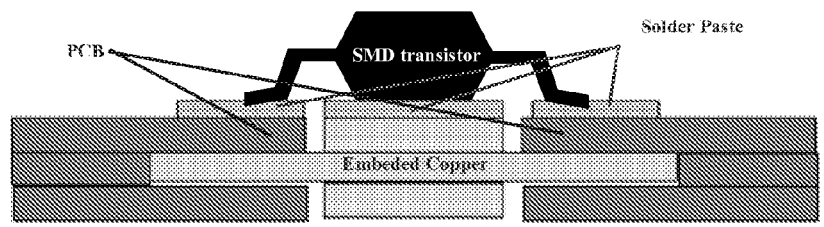
FIG. 4 schematically illustrates a configuration of a PCB having a RF power transistor soldered thereon through an embedded coin technique.
Figure 5:
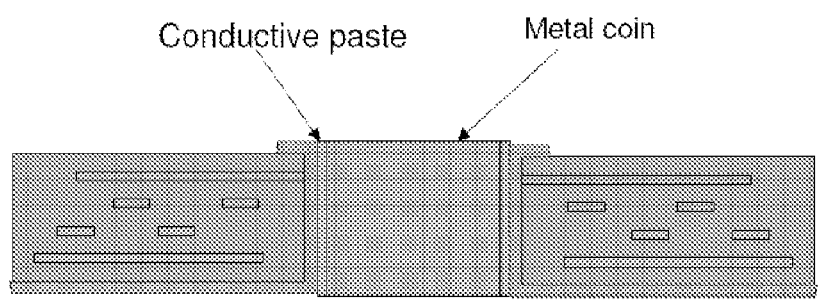
FIG. 5 schematically shows a configuration of a PCB in which an insertion coin technique is employed.

The present invention is based on an insertion coin technique which is used to solve a heat dissipation problem of a Surface Mounted Device (SMD) with a small package. FIG. 5 schematically shows a configuration of a PCB in which the insertion coin technique is employed. In the implementation shown in FIG. 5, first a PCB is manufactured with a plated cutout whose size is slightly larger than the SMD's lead. Then a metal coin is inserted into the plated cutout and adhered to the PCB via a conductive paste at the flank of the metal coin. The metal coin is rectangular (for example square) and a surface dimension thereof is generally the same as that of the SMD's lead. So the inserted metal coin provides a very good route for heat dissipation, and the plated cutout's wall provides a large area of copper connection between a top layer and a middle layer in the PCB, which offers a very good ground connection.

However, the insertion coin technique is not applicable to a high power RF transistor with a larger flange, because considering that the thickness of a multilayer PCB for the high power RF transistor is generally about 2 mm or less, the max size of the coin should not be larger than 10 mm*10 mm in view of mechanical reliability. For example, a flange of a 900 MHz 100 W RF power transistor is about 9 mm*21 mm. If only one inserted coin is used as a whole pad for soldering the RF power transistor on a PCB, a connection between the inserted coin and the PCB is frail from a mechanical viewpoint. The inserted coin may be separated from the PCB and the PCB becomes a reject just after reflowing. So the PCB suffers a problem of reliability during soldering and production.

In view of the preceding, the present invention has made a novel thermal pad formed on a PCB, which is applicable to an SMD with a large package, for example, a surface mounted high power transistor with a large flange, while possessing the above-mentioned advantages of the insertion coin technique.

Specifically, the thermal pad according to the present invention comprises in its interior at least one coin made of metal (for example copper) or alloy as a part of it. That is, the size of the at least one coin is smaller than that of the thermal pad.

In an actual implementation of the present invention, the thermal pad may comprises in its interior one or more coins and a plurality of through vias. Each of the one or more coins has a height equal to a thickness of the PCB, and is inserted into a corresponding one of one or more plated cutouts straight through the PCB in the thermal pad, and bonded to side walls of the corresponding one of the one or more plated cutouts with a paste capable of resisting a temperature of 250° C. or above. The plurality of through vias are plated, and plugged with a solder mask such as an epoxy. The thermal pad has a flat top surface and a flat bottom surface, either of which is coplanar with a corresponding one of top and bottom surfaces of the PCB.

Figure 6A:
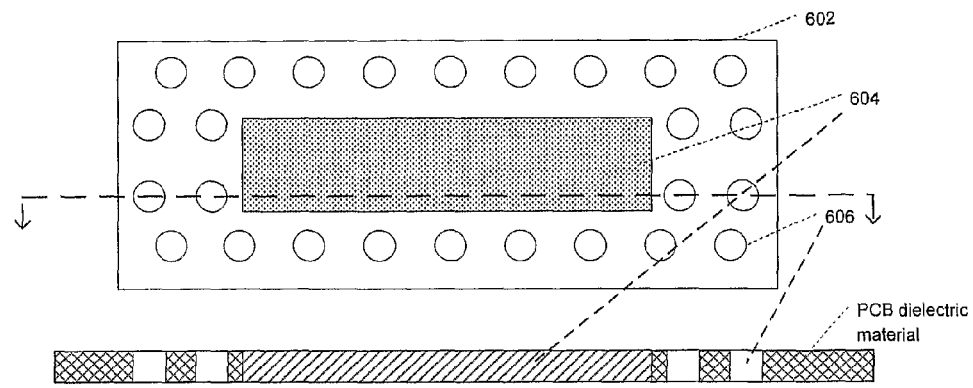
FIGS. 6A-6C schematically show a kind of patterns of thermal pads according to embodiments of the present invention.
Figure 6B:
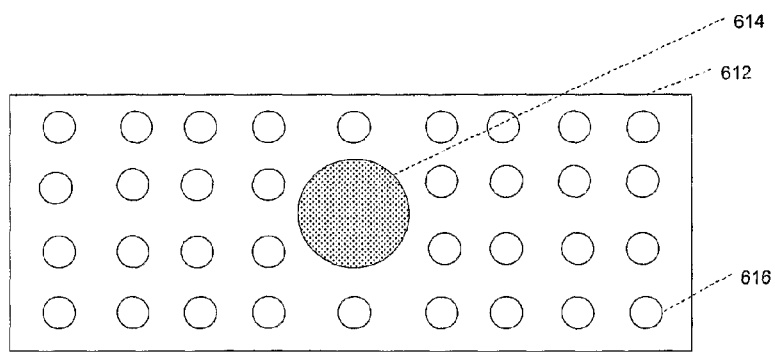
Figure 6C:
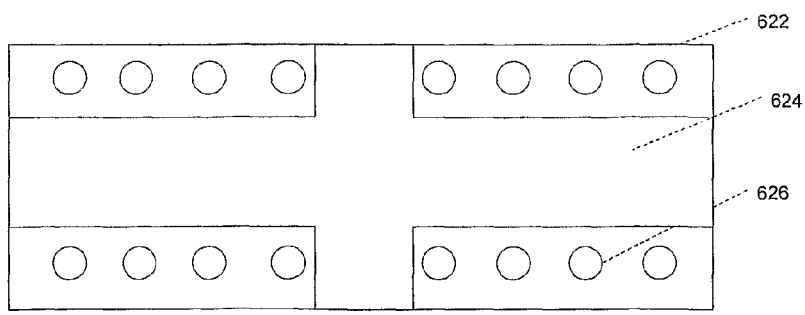

FIGS. 6A-6C schematically show a kind of patterns of the thermal pads 602, 612, 622 according to the above-mentioned implementation, in which one coin 604, 614, 624 is located in the central area of the thermal pad 602, 612, 622, and a plurality of through vias 606, 616, 626 are uniformly distributed in the rest of the thermal pad 602, 612, 622. In particular, the shape of the one coin 604, 614, 624 is a rectangle as shown in FIG. 6A, a circle as shown in FIG. 6B, or a cross as shown FIG. 6C. In FIG. 6A, an upper par thereof is a top view of the thermal pad 602 in a PCB, and a lower part thereof is a section view of the thermal pad 602 taken along a dotted line shown in the upper part.

Figure 7A:
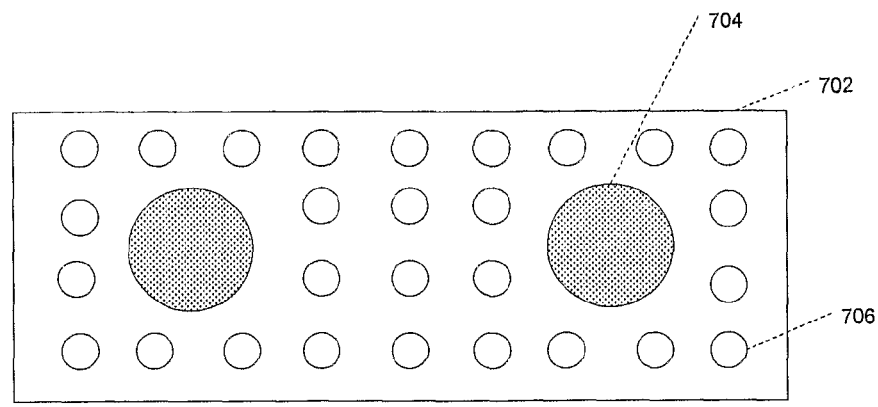
FIGS. 7A-7B schematically show another kind of patterns of the thermal pad s according to embodiments of the present invention.
Figure 7B:
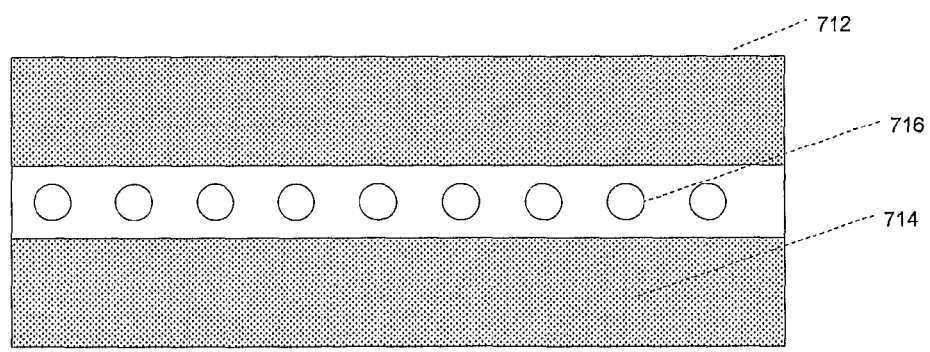

FIGS. 7A-7B schematically show another kind of patterns of the thermal pads 702, 712 according to the above-mentioned implementation, in which two coins 704, 714 having the same shape are distributed symmetrically about a central line of the thermal pad 702, 712, and a plurality of through vias 706, 716 are uniformly distributed in the rest of the thermal pad 702, 712. In particular, the shapes of the two coins are both rectangles as shown in FIG. 7A, or circles as shown in FIG. 7B.

In another actual implementation of the present invention, the thermal pad may comprise in its interior only a plurality of coins. That is, the thermal pad does not comprise in its interior the plurality of through vias as stated above. Each of the plurality of coins has a height equal to a thickness of the PCB, and is inserted into a corresponding one of a plurality of plated cutouts straight through the PCB in the thermal pad, and bonded to side walls of the corresponding one of the plurality of plated cutouts with a paste capable of resisting a temperature of 250° C. or above. The thermal pad has a flat top surface and a flat bottom surface, either of which is coplanar with a corresponding one of top and bottom surfaces of the PCB.

Figure 8A:
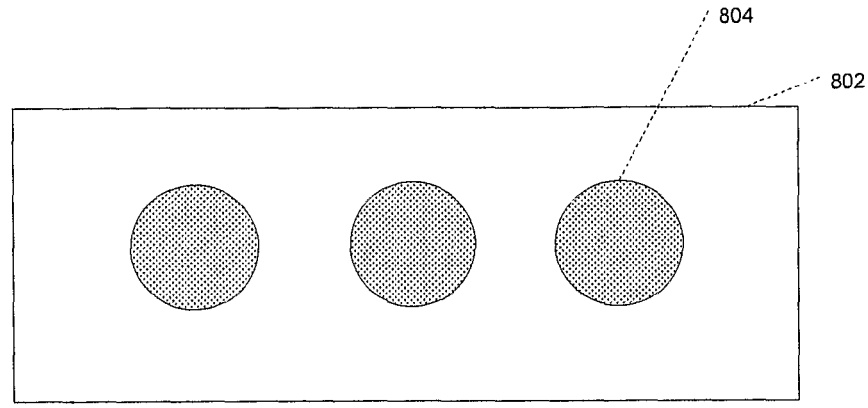
FIG. 8A schematically shows three circular coins uniformly distributed in a thermal pad according to an embodiment of the present invention.
Figure 8B:
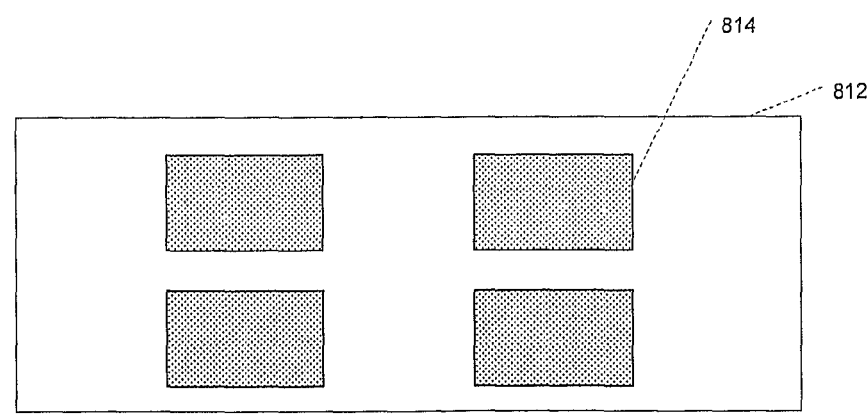
FIG. 8B schematically shows four rectangular coins uniformly distributed in a thermal pad according to an embodiment of the present invention.

In the actual implementation, preferably, the plurality of coins are uniformly distributed in the thermal pad. The plurality of coins have the same shape which may be a circle or a rectangle. For example, FIG. 8A schematically shows three circular coins 804 uniformly distributed in the thermal pad 802, and FIG. 8B schematically shows four rectangular coins 814 uniformly distributed in the thermal pad 812.

In the case of the thermal pads as described above, heat is dissipated through the metal or alloy coins and the side walls of the plated cutouts, and possibly walls of the through vias. The coins increase heat conductive areas and hence help to reduce temperatures of the high power RF device and of the PCB. Furthermore, RF ground circuits comprise the coins and the side walls of the plated cutouts, and possibly the walls of the through vias. The coins have a low resistance and shorten a ground loop, which offers a very good ground for the high power RF device. The reduced temperatures are propitious to extending product lifetime and a good electrical performance is favor of product reliability.

Figure 9:
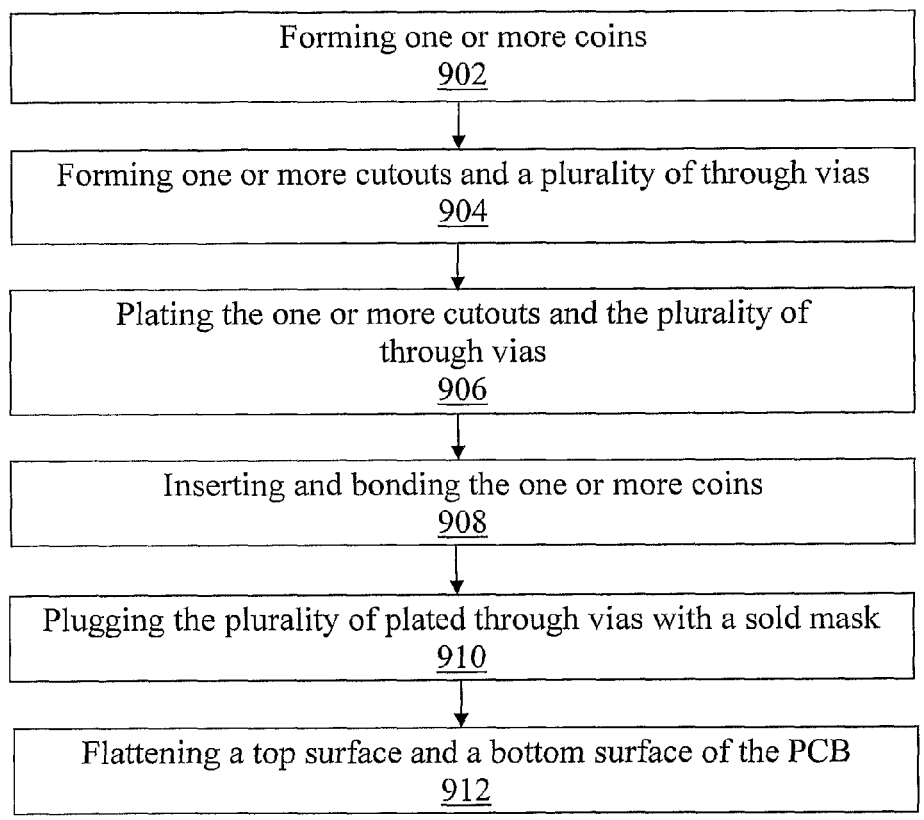
FIG. 9 shows a flow chart illustrating a method of forming the thermal pads shown in FIGS. 6A-6C and 7A-7B on a PCB.

Referring to FIG. 9, there is shown a flow chart 900 illustrating a method of forming the thermal pads as shown in FIGS. 6A-6C and 7A-7B on a PCB. It should be understood that the method is not necessarily limited to the illustrated sequence, some steps may be omitted as desired, and some steps may be performed together or otherwise in an interrelated fashion.

The method begins with step 902 in which one or more coins are formed, each being made of metal (for example copper) or alloy and having a height equal to a thickness of a net PCB. The number of the formed coins depends on the number of coins contained in the thermal pad to be formed.

In step 904, one or more cutouts and a plurality of through vias are formed straight through the net PCB in an area for forming the thermal pad. Each of the one or more cutouts corresponds to a corresponding one of the one or more coins and has the same size as the corresponding one of the one or more coins. Then in step 906, the one or more cutouts and the plurality of through vias are plated.

It should be noted that step 902 and steps 904-906 are performed separately. This means that step 902 and steps 904-906 can be performed simultaneously or successively.

In step 908, the one or more coins are inserted into the corresponding ones of the one or more plated cutouts, and bonded to side walls of the corresponding ones of the one or more plated cutouts with a paste capable of resisting a temperature of 250° C. or above. The paste can be conductive (such as Ag-filed epoxy) or nonconductive. In step 910, the plurality of plated through vias are plugged with a solder mask such as an epoxy to prevent solder paste from leaking.

In step 912, a top surface and a bottom surface of the PCB with the thermal pad are flattened via a surface process. Since the coins and the PCB have different tolerance deviations, surface flatness of the PCB having the inserted coins is checked through an infrared scanning technique or any other suitable measurement technique. The surfaces of the PCB are partly machined and the whole PCB is replated with copper if necessary. After that, alloy is used to plate the top and bottom surfaces of the PCB. Electroless Ni/Au is often utilized as a plating material to copper from being oxidized.

Figure 10:
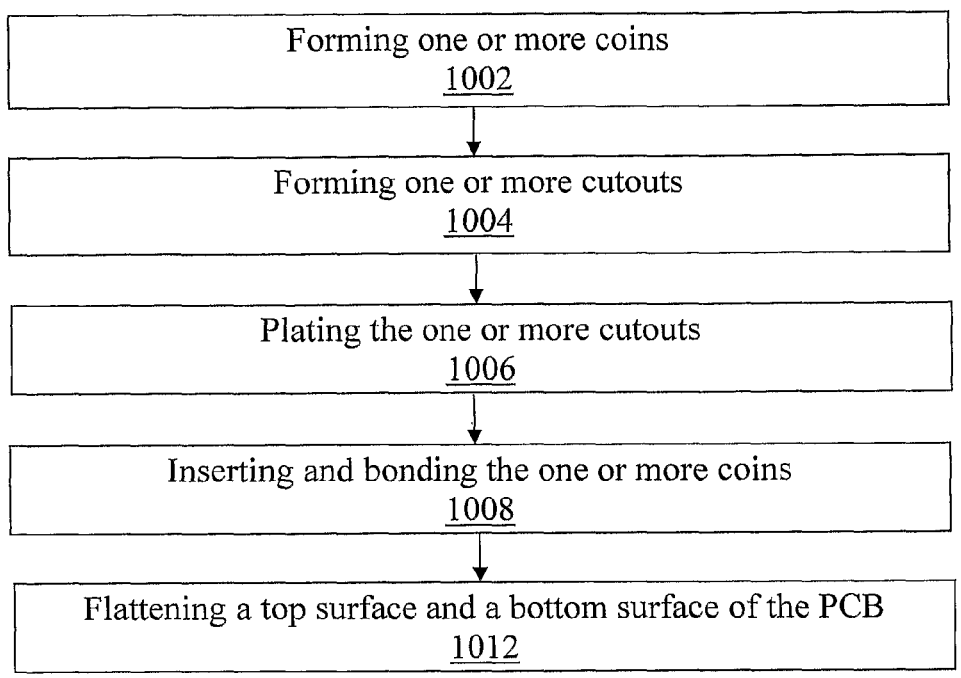
FIG. 10 shows a flow chart illustrating a method of forming the thermal pads shown in FIGS. 8A-8B on a PCB.

FIG. 10 shows a flow chart 1000 illustrating a method of forming the thermal pads as shown in FIGS. 8A-8B on a PCB. The method of FIG. 10 is the same as that of FIG. 9 except that the method of FIG. 10 does not include the steps involving the through vias.

Specifically, the method of FIG. 10 begins with step 1002 in which one or more coins are formed, each being made of metal or alloy and having a height equal to a thickness of a net PCB. The number of the formed coins depends on the number of coins contained in the thermal pad to be formed.

In step 1004, one or more cutouts are formed straight through the net PCB in an area for forming the thermal pad. The one or more cutouts correspond to the one or more coins and have the same size as the corresponding ones of the one or more coins. Then in step 1006, the one or more cutouts are plated.

It should be noted that step 1002 and steps 1004-1006 are performed separately. This means that step 1002 and steps 1004-1006 can be performed simultaneously or successively.

In step 1008, the one or more coins are inserted into the corresponding ones of the one or more plated cutouts, and bonded to side walls of the corresponding ones of the one or more plated cutouts with a paste capable of resisting a temperature of 250° C. or above. The paste can be conductive (such as Ag-filed epoxy) or nonconductive.

In step 1012, a top surface and a bottom surface of the PCB with the thermal pad are flattened via a surface process. Since the coins and the PCB have different tolerance deviations, surface flatness of the PCB having the inserted coins is checked through an infrared scanning technique or any other suitable measurement technique. The surfaces of the PCB are partly machined and the whole PCB is replated with copper if necessary. After that, alloy is used to plate the top and bottom surfaces of the PCB. Electroless Ni/Au is often utilized as a plating material to copper from being oxidized.

Figure 11:
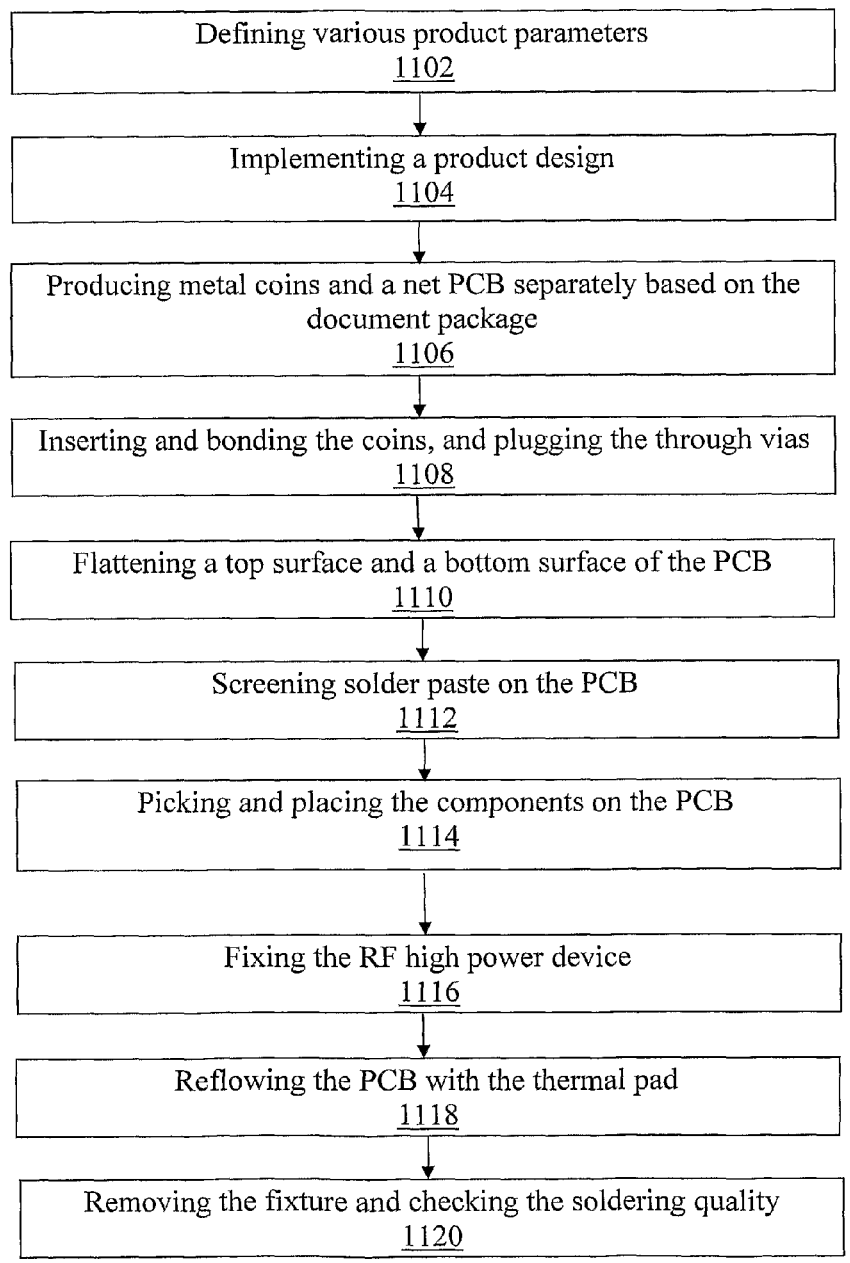
FIG. 11 shows an exemplary complete process for soldering a surface mounted RF high power device on a PCB in which the present invention is applied.

Referring to FIG. 11, there is shown an exemplary complete process 1100 for soldering a surface mounted RF high power device on a PCB in which the present invention is applied. The process 1100 begins with step 1102 defining various product parameters including a thermal pad pattern, PCB parameters, and mechanical tolerances.

Figure 12:
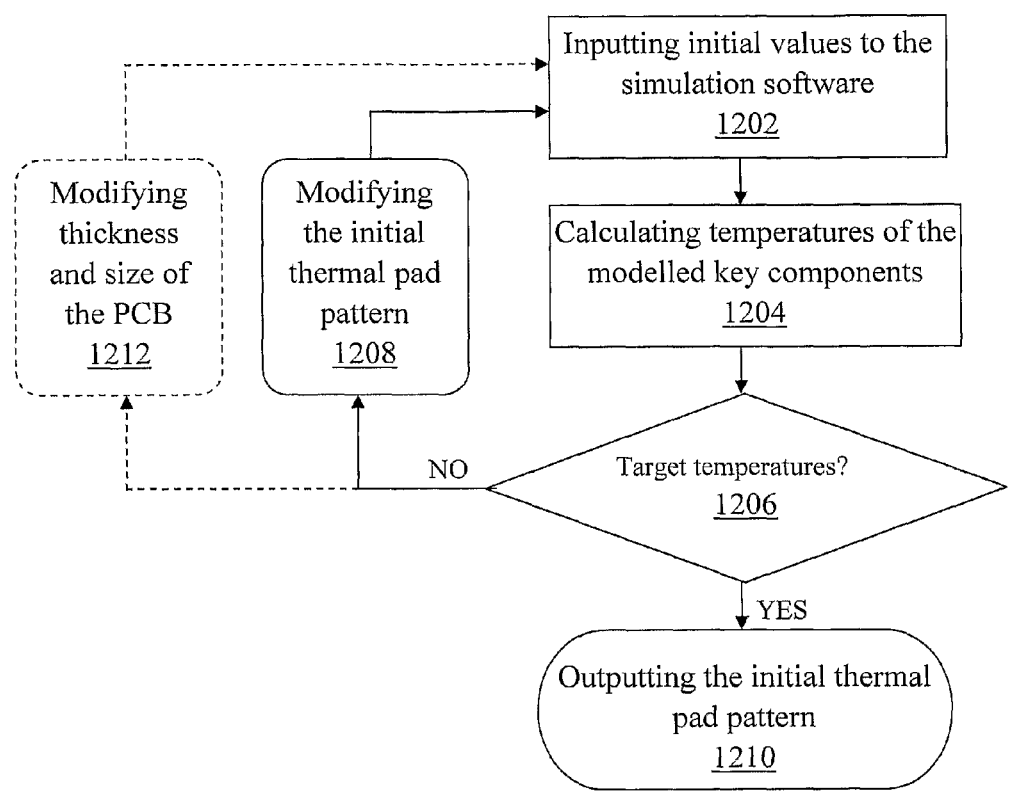
FIG. 12 shows an exemplary optimization process of a simulation software.

A suitable thermal pad pattern is determined by a simulation software in the present invention. Turning to FIG. 12, there is shown an exemplary optimization process 1200 of the simulation software. First, initial values are input to the simulation software in step 1202. The initial values comprise thickness and size of the PCB, power consumptions of key components, and an initial thermal pad pattern. The power consumptions of the key components can be obtained through modelling. There are many kinds of initial thermal pad patterns available. It is preferable to start from a simple case with one coin and a normal array of through vias.

In step 1204, temperatures of the modelled key components are calculated with the initial values by the simulation software. In step 1206 it is determined whether the calculated temperatures reach target temperatures. If the answer in step 1206 is YES, the optimization process 1200 proceeds to step 1210 where the initial thermal pad pattern is output as the suitable thermal pad pattern. Contrarily, if the answer in step 1206 is NO, the optimization process 1200 proceeds to step 1208 where the initial thermal pad pattern is modified as a new initial thermal pad pattern, for example by modifying size, shape, and distribution of the coin, adding more coins, and modifying distribution of the through vias. The new initial thermal pad pattern is input to the simulation software in step 1202.

Steps 1202-1208 are performed repeatedly until the suitable thermal pad pattern is obtained. If the calculated temperatures can not reach the target temperatures only by modifying the thermal pad pattern, step 1212 is performed where one or both of the thickness and size of the PCB are modified.

Referring back to FIG. 11, still in step 1102, the PCB parameters are from a Design Specification (DS), including the size, thickness and stack of the PCB. The stack of the PCB can be appropriately chosen to optimize product performance. For a multilayer PCB, a bottom layer can be core or prepreg. After both the thermal pad pattern and the PCB parameters, the mechanical tolerances are then defined by a software. It is preferable to use a square root of sum of squares method to define the mechanical tolerances.

In step 1104, in accordance with the defined parameters, a product design including PCB layout and coin mechanical design is implemented via an Electronic Design Automation (EDA) software to produce a document package containing Gerber files, mechanical files and assembling files. The vias need to be particularly noted in the document package. Coin parameters are also provided by the document package.

In step 1106, metal coins and a net PCB are produced separately based on the document package. Heights of the metal coins are equal to the thickness of the PCB, and tolerances of the metal coins need to be carefully controlled during producing the metal coins. The net PCB is produced in a normal process, such as stacking PCB material laminates, expressing and so on. Then the vias are drilled in the PCB and the PCB is cut out with required outline. All the vias and cutouts are replated.

In step 1108, the coins are inserted into the cutouts of the PCB, and bonded to side walls of the cutouts via a paste capable of resisting a temperature of 250° C. or above. The paste can be conductive (such as Ag-filled epoxy) or nonconductive. All the vias on the thermal pad or even around it are plugged by a sold mask such as epoxy to prevent solder paste from leaking.

In step 1110, a top surface and a bottom surface of the PCB with the thermal pad are flattened via a surface process. Since the coins and the PCB have different tolerance deviations, surface flatness of the PCB having the inserted coins is checked through an infrared scanning technique or any other suitable measurement technique. In general, a coplanarity requirement for the surfaces of the PCB is ±0.003" (0.08 mm). The surfaces of the PCB are partly machined and the whole PCB is replated with copper if necessary. For bigger coins, it is difficult to achieve a small tolerance and hence complete the surface process easily. PCB suppliers may have to do some tries on the surface process to obtain a satisfied solution. After that, alloy is used to plate the top and bottom surfaces of the PCB. Electroless Ni/Au is often utilized as a plating material to copper from being oxidized.

In step 1112, solder paste is screened on the PCB. A solder paste pattern with certain qualities needs to be designed for the invented thermal pad in order to get a better soldering quality.

Figure 13A:
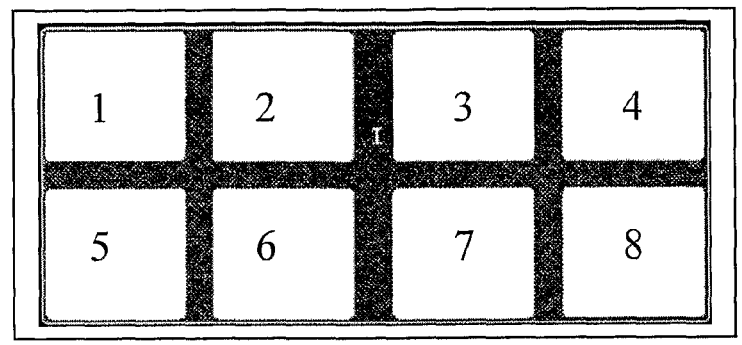
FIG. 13A shows a normal solder paste pattern.

For example, for a TO-272 WB-16 GULL package, normal solder paste has a pattern shown in FIG. 13A. The solder mask contains eight small blocks 1-8. However, for the thermal pad with internal coins and vias, the solder mask in FIG. 13A is not a suitable pattern, because solder paste on the coins and on the vias melt at different time due to thermal ununiformity. To keep better soldering, finer solder paste blocks are used for coin part.

Figure 13B:
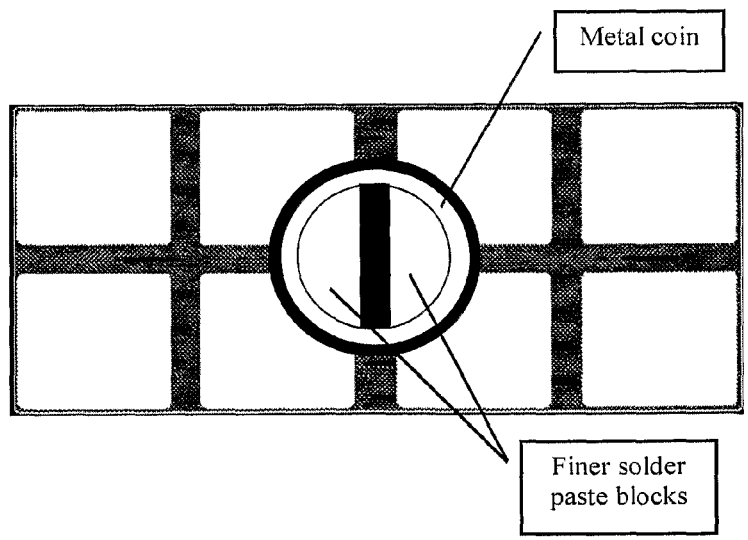
FIG. 13B shows a preferred solder paste pattern for use with a thermal pad of FIG. 6B.

For example, for the thermal pad with a circular coin as illustrated in FIG. 6B, a preferred solder paste is shown in FIG. 13B. Two solder paste blocks with sector shapes are added for the coin, and the solder paste blocks around the coin are also modified to fit the shape of the coin.

In step 1114, the components are picked and placed on the PCB. This step is the same as that for a normal PCB and finished in a placement machine. The components are handled in sequence. Usually thin and small components are placed firstly. The RF high power device, some big packages and higher components are placed before the end of placement.

In step 1116, the RF high power device is fixed through a certain fixing method, such as by means of a fixture or screws, to keep it in position during soldering, because the RF high power device having a large package is easier to shift when going through reflow.

In step 1118, the PCB with the thermal pad is reflowed through a formal soldering process. Since the coins have a small size, it is not easy to move them down, and the tolerances are much easier to control, which helps to improve yield.

In step 1120, the fixture is removed and the soldering quality is checked by a certain tool together with a software. The circuit board after passing a qualification examination can be prepared for assembling to a heatsink by a normal procedure.

In such a way, the RF high power device with a big size is fixed securely to the PCB. A very strong connection is realized between the RF high power device, the PCB and the coins, because the three parts are soldered together. Moreover, the thermal pad of the present invention provides good electrical and thermal performance.

Therefore, by utilizing the thermal pad and method of forming the same of the present invention, good reliability, satisfied thermal and ground performance, and reasonable cost effectiveness can be obtained.

Figure 14:
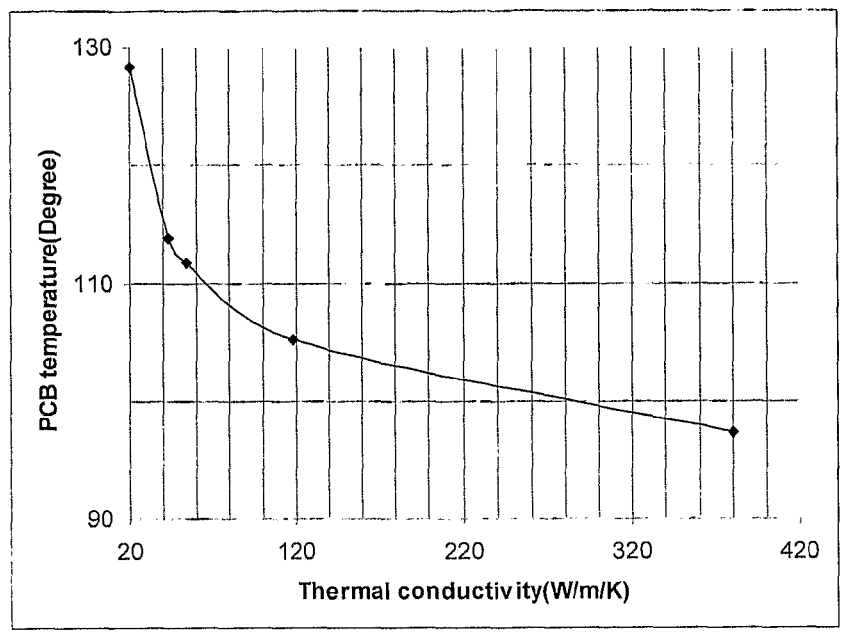
FIG. 14 shows a simulation result of how thermal conductivity impacts on PCB pad temperature.

The advantages of the present invention will be discussed below in more detail in conjunction with the prior art as described in the preceding section BACKGROUND. One advantage is that the present invention provides a flexible design. FIG. 14 shows a simulation result of how thermal conductivity impacts on PCB pad temperature. A thermal conductivity of 20 W/m/K means there are only through vias on a pad, and a thermal conductivity of 380 W/m/K means using copper as a whole pad. The simulation result shows in the case that thermal conductivity is less than 120 W/m/K, thermal dissipation ability is quickly improved and PCB pad temperature is significantly reduced by increasing thermal conductivity. But once thermal conductivity is over 120 W/m/K, the rate of reduction of PCB pad temperature becomes slow. For instance, PCB pad temperature only reduces by 7.9° C. when thermal conductivity changes from 118.5 W/m/K to 380 W/m/K. This means PCB pad temperature can not reduce in proportion to the increase of thermal conductivity.

In view of this simulation result, the pad can be designed according to thermal dissipation requirement. The thermal dissipation ability is mainly determined by metal coins, so the size and number of the metal coins can be adjusted to ensure a stable quality of a PCB and meet thermal dissipation requirement.

For the attached coin technique, the size and shape of the coin are limited by producibility and reliability. The size of the coin should be larger than that of the pad of the RF power transistor and the shape thereof is rectangular, since the coin needs enough edge to be soldered or pasted on the PCB and keep perfect touch with the PCB even after working for a long term.

Figure 15:
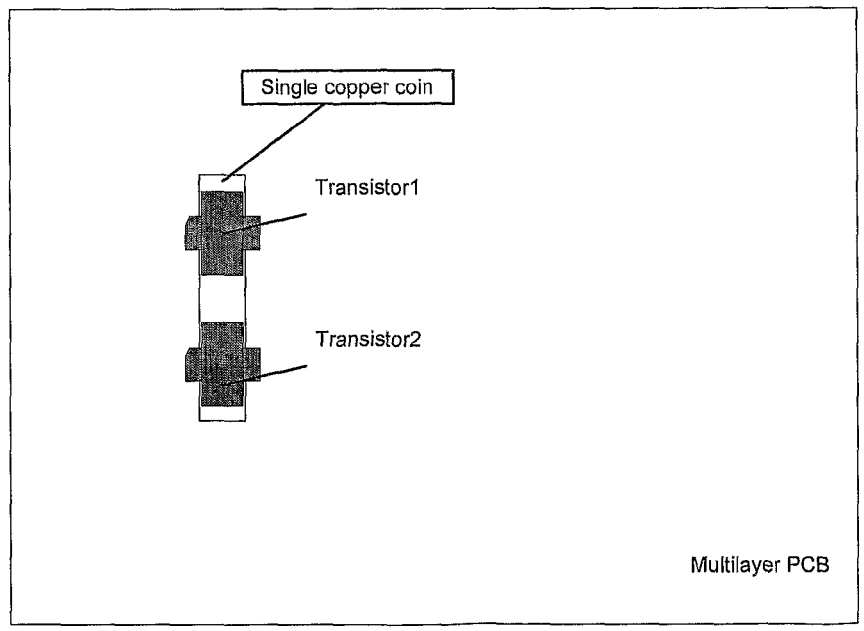
FIG. 15 shows a PA PCB with a larger copper coin for keeping good RF ground and thermal dissipation on both transistors.

If a PA PCB is designed with transistors closer each other, a larger copper coin has to be considered to keep good RF ground and thermal dissipation on both transistors, as shown in FIG. 15. From a viewpoint of thermal dissipation, a smaller size copper can meet the requirement and still has a margin. But because of the limits of the PCB structure and production feasibility, a larger coin size has to be selected, which has a big margin but a higher cost.

For the attached coin technique, the minimum thickness of the PCB is restricted by the coin. In order to mount the metal coin, a cost-efficient solution of the PCB may have to be given up and more cost solution of adding the layer thickness has to be selected to keep good thermal dissipation.

In contrast, for the thermal pad with internal coin and via of the present invention, the coin is smaller than the transistor pad, and the shape is variable, such as rectangular, cross and circular shapes. The coin position can be set closer to a point under a hottest die. According to thermal dissipation requirement, suitable size, position, shape and number of the coins can be selected. Also, there are few limits on the PCB thickness, since the coin has more selective sizes and less requirement on the PCB thickness.

So compared with the attached coin technique, the present invention provides more selection on size, position, shape and number of the coins to get an improved thermal performance. Further, the PCB thickness can be determined for a better RF performance without considering coin limit. It means that an optimized solution can be chosen to meet RF performance and thermal dissipation requirement with a reasonable margin.

Figure 16:
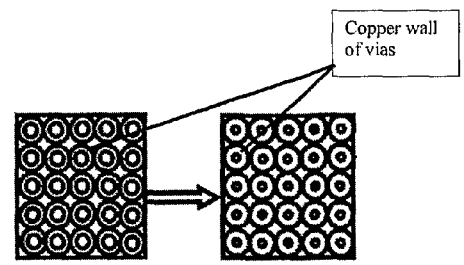
FIG. 16 shows an increase of copper thickness of vias in a pad of 6 mm*6 mm.

Another advantage is that the present invention provides effective thermal dissipation. PCB pad temperature has been measured after copper thickness of vias is increased. The pad is 6 mm*6 mm and the copper thickness is increased from 1 mil to 2.5 mil, as shown in FIG. 16. Both test and simulation results are given in table 1 below. The temperature of a test point, which is 2 mm away from a driver output pin, is 1.9° C. to 2.1° C. lower than for normal vias. The simulated temperature reduces by from 2.3° C. to 2.4° C., which is very closer to the test result. So the simulation result is believable. The simulation result shows that the pad temperature is 8.5° C. lower than for normal vias.

TABLE 1

Temperature result of a PCB with 65 μm thick copper vias

|  |  | Reduced Temperature ΔT (° C.) (2 mm away from driver output pin) | Reduced Pad temperature ΔT (° C.) |
|---|---|---|---|
| Test result | Driver 1 | 1.9 |  |
|  | Driver 2 | 2.1 |  |
| Simulation result |  | 2.3-2.4 | 8.5 |

The stepped coin technique for surface mounted drivers has been tested. The coin on the top surface of a PCB is about 6 mm*6 mm. Two drivers at different positions on the PCB have been tested. The test result is listed in table 2 below. The temperature for driver 1 reduces by 3.4° C., while driver 2 has almost no reduction on temperature. The test result is not as good as expected. One reason is that the stepped cavity board from a PCB supplier has a poor flatness. Such flatness and result can not be accepted for a volume production.

TABLE 2

Test result for stepped coin

| PCB board | Driver 1 | Driver 2 |
|---|---|---|
| Original P0 | 95.0° C. | 89.4° C. |
| Stepped coin | 91.6° C. | 89.0° C. |

The copper thickness of vias and corresponding thermal conductivity are given in table 3 below. For a 2.5 mil thick copper, the thermal conductivity is 53.6 W/m/K. If the thickness of the copper is increased to 10 mil, the thermal conductivity is increased to 118.5 W/m/K.

TABLE 3

Via copper thickness and corresponding thermal conductivity

| Via drill diameter | Copper in via | Thermal conductivity through PCB |
|---|---|---|
| 0.5 mm | 25 μm (1 mil) | 20 W/m/K |
| 0.5 mm | 50 μm (2 mil) | 42.7 W/mK |
| 0.5 mm | 65 μm (2.5 mil) | 53.6 W/m/K (tested) |
| 0.5 mm | 250 μm (10 mil) | 118.5 W/mK |

The thermal conductivity for the present invention is nearly between 100 W/m/K and 300 W/m/K. According to FIG. 14, we can get a 23.1° C. temperature decrease if the thermal conductivity rises from 20 W/m/K to 120 W/m/K. So based on the thermal simulation, the present invention can provide effective heat dissipation and significantly reduce PCB temperature.

A further advantage is that the present invention provides a lower cost compared with the attached coin technique. The manufacture cost of the insertion coin is much lower than that of the attached copper coin because of less copper and a simpler manufacture process.

Compared with a normal PCB without coin, the attached coin technique will increase the PCB cost by at least 30 percent, while the insertion coin technique only increases by less than 20 percent. No matter which kind of the attached coin technique is used, the coin should have at least the same surface area as a transistor pad, which needs more copper and has a higher cost. In contrast, for the thermal pad of the present invention, the coin size is less than a transistor's flange. This means less copper is used. By reasonably selecting coin size and number, a good trade-off between cost and thermal dissipation can be made.

Further, for a non straight through cutout technique such as the stepped coin technique and the embedded coin technique, compared with a normal PCB process, the following working procedure has to be done before a SMT line:
different PCB layers have to be cut with required size to get stepped cutout, and then
the coin is attached to the PCB using a high temperature solder paste or a conductive glue.

For the present invention, however, all layers have the same cutout size, so there is no need for a separate process on PCB different layers during manufacturing. Because the step of separately cutting on different layers for the non straight through cutout technique is eliminated, the product cost can reduce by over 10 percent.

Figure 17:
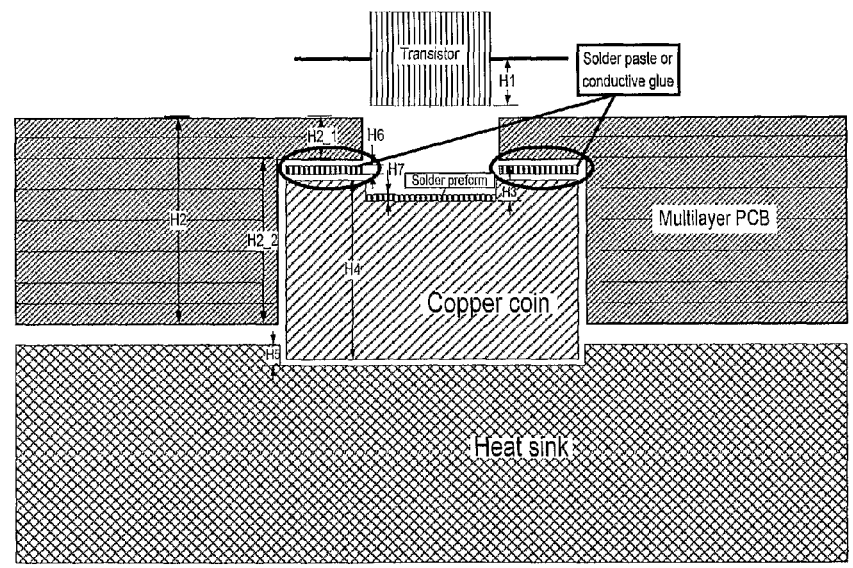
FIG. 17 shows a structure used in the stepped coin technique which consists of a transistor, a PCB, a copper coin, a solder paste or a conductive glue, and a heatsink.

Yet a further advantage is that the present invention provides a better stable connection between the coin, the RF power transistor and the PCB compared with the stepped coin technique. On one hand, the thermal pad of the present invention is more stable for SMT reflow soldering. A structure used in the stepped coin technique consists of a transistor, a PCB, a copper coin, a solder paste or a conductive glue and a heatsink, as shown in FIG. 17.

The copper coin is soldered to the PCB by the solder paste or adhered to the PCB by the conductive glue. Only a small part of coin surface is soldered or adhered to the PCB, which means only the surface around the step (areas within ellipses in FIG. 17) contacts the PCB. The contact surface is smaller compared with the copper coin size. When the PCB with the attached coin goes through a reflow oven, the coin is easier to fall down from the PCB, especially for lead free soldering.

Figure 18:
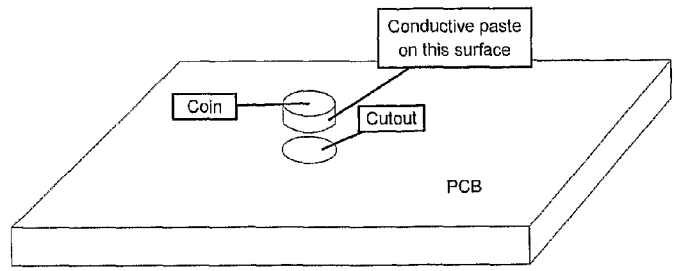
FIG. 18 shows a contact surface between an internal coin of a thermal pad of the present invention and a PCB.

The thermal pad of the present invention enlarges a contact surface between the internal coin and the PCB. The cutout is plated and the coin is adhered to the plated cutout by a conductive paste or a nonconductive paste on the flank, as shown in FIG. 18.

Figure 19:
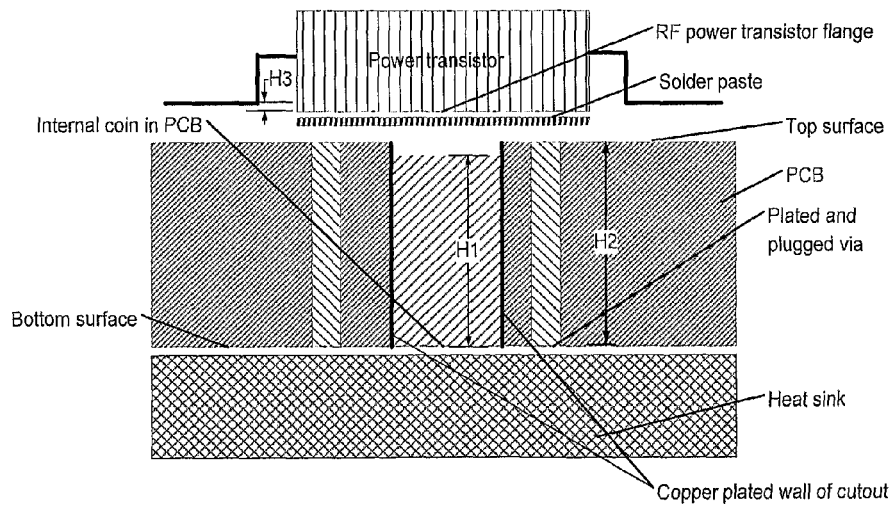
FIG. 19 is a mounting sketch of a thermal pad according to an embodiment of the present invention.

So compared with the attached coin technique, the ratio of the connect surface to the whole coin surface is increased greatly. As shown in FIG. 19, a top surface of a coin is soldered to a bottom case of a power transistor. Since the coin is smaller than the case, the case gives coin attraction to further prevent it from falling down. When going through reflow soldering, the internal coin can keep hard adhered to a PCB under the effect of surface tension on flank and attraction from the top surface, which ensures a high stability of the connection.

On the other hand, the thermal pad of the present invention is more stable from a viewpoint of mechanical tolerance. The tolerances of high power device, PCB, copper coin and heatsink all have impact on the connection status, especially considering batch difference.

For the attached coin technique, there are many factors affecting the connection:
During using an SMT, a device case is soldered to a copper coin by a solder preform, which needs to accurately control the thickness and size of the solder preform. The solder preform thick H7 should cover the tolerance of transistor height H1, PCB thick H2, recess or step height of coin H3 and coin height H4 (see FIG. 17). Lack of solder preform, the transistor cannot contact the copper coin enough, and will not work normally. Too much solder is easier to cause a shortcircuit between the transistor pin and the ground since the solder may "climb" up to the transistor pin.

When the board is mounted to a heatsink, it may occur that the copper coin cannot contact the heatsink enough for tolerance variation.

Except for the embedded coin plug, there are two unstable connection problems in the attached coin technique: the transistor to the coin and the coin to the heatsink. To keep product stable, the tolerance should be well determined. And the quantity of solder paste or conductive paste has to be carefully controlled. But it's quite difficult to handle all the factors at the same time.

For the thermal pad of the present invention, as shown in FIG. 19, it can be seen that the connection of the present invention is impacted by the power transistor, the height tolerances of the internal coin and the PCB.

The internal coin has the same height as the PCB. The bottom of the PCB should meet flatness requirement, so the bottom surface of the coin should be kept coplanar with the bottom of the PCB. From a viewpoint of manufacture, it can easily keep the coin to be coplanar with the PCB on the bottom surface by controlling tolerance.

The heatsink surface under the coin is flat without cavity. Tolerance controlling of cavity is escaped.

If the top surface of the coin has a height difference from the PCB's height, the difference can also be controlled under a certain value by tolerance requirement. And the tolerance variation between H1 and H2 is easier to cover by solder paste. Compared with the PCB and the internal coin tolerance, device tolerance is smaller, especially for a plastic package of a RF power transistor, and the tolerance even can be ignored.

According to the experience from the stepped coin technique, the conclusion is that it's difficult to implement the stepped coin technology in a volume production right now. The main problem is the board flatness.

Compared with the attached coin technique, the thermal pad of the present invention has less tolerance uncertainty. The thermal pad has less mechanical deviation, which is mainly introduced by height tolerance of the coin and the PCB. So the present invention is more stable for the mechanical and electrical connection.

Incidentally, based on the present invention, if the top surface also has a strict flatness requirement, the top surface can be milled and replated after inserting the coin in the PCB. Then the top surface can also be kept good flatness. The process can be easily implemented by the present technique without additional difficulty, and the cost will not be increased too much.

Yet a further advantage is that the present invention fits a high power RF transistor for a SMT line. The through-via technique has a limited thermal dissipation, so the technique is only valid for a low power transistor, such as driver or quite high efficiency transistor with peak output power less than 80 W (CW signal).

The attached coin technique provides a better heat dissipation than the through-via technique. Generally, a higher power transistor has a bigger flange. That means for the high power RF transistor, a bigger copper coin has to be used. The bigger coin has problems of lower connection reliability and yield. The bigger coin has larger tolerance and weight, so it's much easier to disconnect from the PCB when in a reflow oven, and the yield will greatly go down.

This present invention can keep good connection reliability by selecting suitable coin size and reducing impact of mechanical tolerance. So it can improve the yield caused by the mechanical connection.

Furthermore, the high power RF transistor can be soldered on the PCB in the SMT line with the same method as other normal components by using the thermal pad of the present invention. The present invention improves work efficiency for assembling units compared with manual operation.

Currently, transistor suppliers intend to provide higher power device with plastic package more than ceramic one to reduce cost. For example, a new surface mounted plastic package for a RF high power transistor has been developed, which reduces the cost of transistor by over 30 percent compared with a traditional ceramic package transistor.

But for this low cost plastic package transistor, RF performance is more sensitive to RF ground and thermal dissipation than a ceramic one. The plastic transistor is more likely to self-oscillate or break without good RF ground and thermal dissipation. Compared with the attached coin technique, the thermal pad of the present invention can fit the SMT plastic package and also provide similar heat dissipation.

Yet a further advantage is that the present invention provides a favorable RF ground performance from a RF design viewpoint. To get a good RF performance, it is important to create a consistent ground. So it needs to provide a grounding method in the close vicinity of the current path discontinuity.

Figure 20:
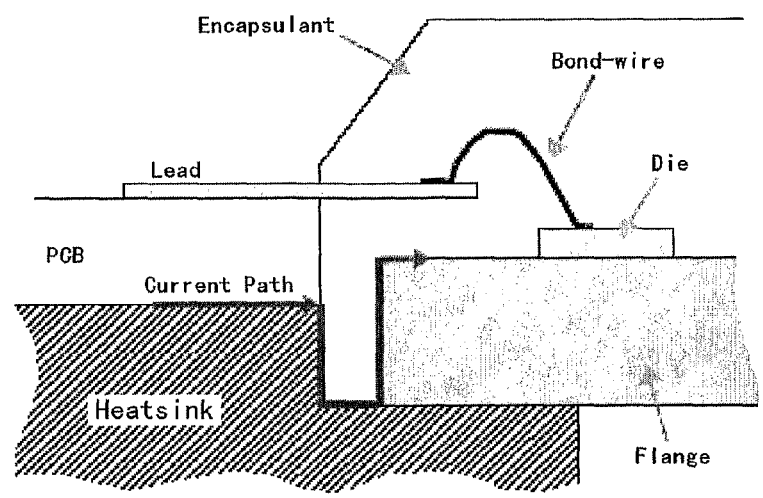
FIG. 20 shows a ground current path according to an old mounting solution.
Figure 21:
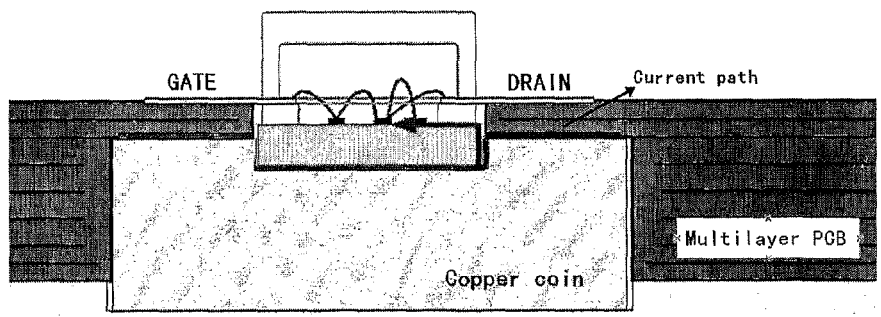
FIG. 21 shows a ground current path according to an attached coin technique.

Vias have higher parasite parameters than coin, so they can not provide as good RF ground as a copper coin. For the old mounting solution, such as the bolt down technique and the attached coin technique with a straight cutout, a current return path of a transistor involves a transistor flange, a heatsink and a ground layer of a microstrip circuit, as shown in FIG. 20. A RF ground path goes from a reference ground layer to the bottom of the PCB, then passes through the heatsink to the transistor flange, finally arrives at a die. The ground path is quite long and the performance is not good.

Whereas for the stepped coin and embedded coin techniques, the current path of the transistor comes from the reference ground layer to the copper coin, then to the flange and back to the die. The ground is shortened and discontinuity is reduced. So they provide best RF grounding.

Figure 22:
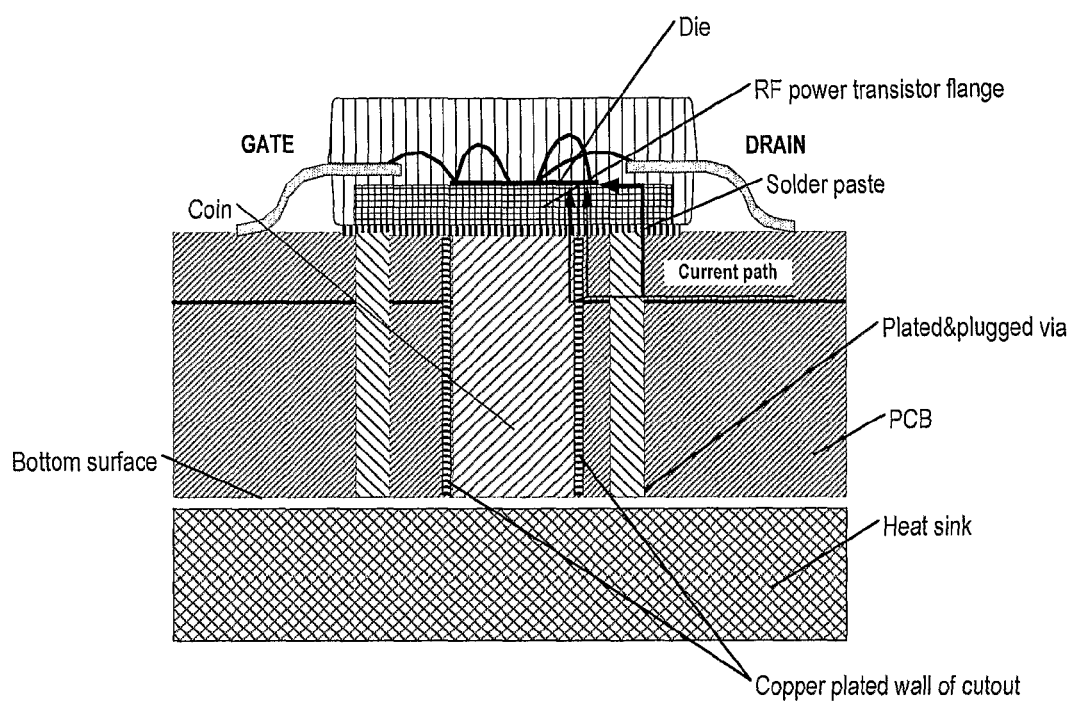
FIG. 22 shows ground current paths according to an embodiment of the present invention.

In the present invention, the wall of the cutout for inserting coin is plated. There are more grounding paths, as shown in FIG. 22. One is from a middle reference ground layer through copper of vias to the transistor flange and then to the die. Another is from the reference ground layer to the coin by passing the transistor flange and then to the die. The third is from the reference ground layer to the copper of the cutout, via the flange and gets to the die. Therefore, for the thermal pad solution of the present invention, apart from the internal coins and vias, the plated cutouts can also provide paths for ground current. So the present invention provides the same good ground connection as the stepped coin technique.

In summary, the present invention provides perfect RF grounding and thermal dissipation since enhanced electrical and thermal dissipation capability from the thermal pad.

Throughout the description and claims of this specification, the words "comprise", "include", "contain", and variations of the words, for example "comprising" and "comprises", means "including but not limited to", and is not intended to (and does not) exclude other components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

It will be understood that the foregoing description of the embodiments of the present invention has been presented for purposes of illustration and description. This description is not exhaustive and does not limit the claimed invention to the precise forms disclosed. Modifications and variations are possible in light of the above description or may be acquired from practicing the present invention. The claims and their equivalents define the scope of the present invention.

The invention claimed is:

1. A thermal pad formed on a printed circuit board (PCB), the thermal pad comprising in its interior:
   a coin, wherein: i) the coin has a height equal to a thickness of the PCB, ii) the coin is made of metal or alloy, iii) the coin is inserted into a corresponding plated cutout straight through the PCB in the thermal pad, wherein the cutout is essentially the same size as the coin, and iv) the coin is bonded to side walls of the corresponding cutout with a paste capable of resisting a temperature of 250° C.; and
   a plurality of through vias, which are plated, and plugged with a solder mask, wherein
   the thermal pad has a flat top surface and a flat bottom surface, either of which is coplanar with a corresponding one of top and bottom surfaces of the PCB.

2. The thermal pad according to claim 1, wherein the one coin is located in the central area of the thermal pad, and the plurality of through vias are uniformly distributed in the rest of the thermal pad.

3. The thermal pad according to claim 2, wherein a shape of the coin is one of a rectangle, a circle, and a cross.

4. The thermal pad according to claim 1, further comprising a second coin, wherein the two recited coins have the same shape and are distributed symmetrically about a central line of the thermal pad, and the plurality of through vias are uniformly distributed in the rest of the thermal pad.

5. The thermal pad according to claim 4, wherein the shapes of the two recited coins are both rectangles or circles.

6. The thermal pad according to claim 1, wherein the metal is copper.

7. The thermal pad according to claim 1, wherein the paste is conductive.

8. The thermal pad according to claim 7, wherein the paste is Ag-filled epoxy.

9. The thermal pad according to claim 1, wherein the solder mask is an epoxy.

10. A method of forming a thermal pad on a printed circuit board (PCB), the method comprising the steps of:
    forming one or more coins, each being made of metal or alloy and having a height equal to a thickness of the PCB;
    forming one or more cutouts and a plurality of through vias straight through the PCB in an area for forming the thermal pad, each of the one or more cutouts corresponding to a corresponding one of the one or more coins and having essentially the same size as the corresponding one of the one or more coins;
    plating the one or more cutouts and the plurality of through vias;
    inserting the one or more coins into the corresponding ones of the one or more plated cutouts and bonding the one or more coins to side walls of the corresponding ones of the one or more plated cutouts with a paste capable of resisting a temperature of 250° C. or above;
    plugging the plurality of plated through vias with a solder mask; and
    flattening a top surface and a bottom surface of the PCB with the thermal pad via a surface process.

11. The method according to claim 10, wherein the step of forming one or more cutouts and a plurality of through vias comprises the steps of:
    forming one cutout straight through the PCB in the central part of the area for forming the thermal pad; and
    forming the plurality of through vias straight through the PCB and uniformly distributed in the rest of the area for forming thermal pad.

12. The method according to claim 11, wherein a shape of the one cutout is one of a rectangle, a circle, and a cross.

13. The method according to claim 10, wherein the step of forming one or more cutouts and a plurality of through vias comprises the steps of:
    forming two cutouts straight through the PCB in the area for forming the thermal pad, the two cutouts having the same shape and being distributed symmetrically about a central line of the area; and
    forming the plurality of through vias straight through the PCB and uniformly distributed in the rest of the area for forming the thermal pad.

14. The method according to claim 13, wherein the shapes of the two cutouts are both rectangles or circles.

15. The method according to claim 10, wherein the metal is copper.

16. The method according to claim 10, wherein the paste is conductive.

17. The method according to claim 16, wherein the paste is Ag-filled epoxy.

18. The method according to claim 10, wherein the solder mask is an epoxy.

19. The thermal pad of claim 1, wherein the coin is fabricated as one piece at the height equal to the thickness of the PCB prior to inserting the coin into the PCB.

20. The thermal pad of claim 19, wherein the thickness of the PCB is not limited by the height of the coin.

21. The thermal pad of claim 1, wherein less than an entire surface area of the coin is bonded to the sidewalls of the corresponding one of the one or more plate cutouts.

22. The thermal pad of claim 1, wherein the coin is not a paste material.

23. The thermal pad of claim 1, wherein the coin is a rigid, solid member.

24. The thermal pad of claim 1, wherein the paste is separate and distinct from the coin.

* * * * *